(12) United States Patent
Asano et al.

(10) Patent No.: US 7,193,493 B2
(45) Date of Patent: Mar. 20, 2007

(54) ALIGNMENT APPARATUS, EXPOSURE APPARATUS, AND DEVICE MANUFACTURING METHOD

(75) Inventors: Toshiya Asano, Tochigi (JP); Yugo Shibata, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 412 days.

(21) Appl. No.: 10/670,241

(22) Filed: Sep. 26, 2003

(65) Prior Publication Data

US 2004/0112164 A1    Jun. 17, 2004

(30) Foreign Application Priority Data

Sep. 30, 2002   (JP)   ............... 2002-287056
Sep. 17, 2003   (JP)   ............... 2003-324688

(51) Int. Cl.
*H01F 7/08*    (2006.01)
(52) U.S. Cl. .................. 335/220; 335/285; 269/8
(58) Field of Classification Search ................ 335/220, 335/284, 285; 269/8
See application file for complete search history.

(56) References Cited

U.S. PATENT DOCUMENTS

| 5,228,358 A | 7/1993 | Sakino et al. ................. 74/479 |
| 5,841,250 A | 11/1998 | Korenage et al. ........... 318/135 |
| 6,037,680 A | 3/2000 | Korenaga et al. ............. 310/12 |
| 6,538,348 B2 | 3/2003 | Sawai et al. .................. 310/12 |
| 6,584,367 B1 | 6/2003 | Makino et al. ............... 700/60 |
| 6,654,098 B2 * | 11/2003 | Asano et al. ................. 355/53 |
| 6,891,597 B2 * | 5/2005 | Sekiguchi ..................... 355/53 |
| 2001/0019229 A1 | 9/2001 | Sawai et al. .................. 310/12 |

FOREIGN PATENT DOCUMENTS

| JP | 09167792 | 6/1997 |
| JP | 2001-22448 | 1/2001 |
| JP | 3145355 | 1/2001 |
| JP | 2001-238485 | 8/2001 |

OTHER PUBLICATIONS

Japanese Office Action dated Jul. 11, 2005, issued in corresponding Japanese patent application number 2003-324688.

* cited by examiner

*Primary Examiner*—K. Lee
*Assistant Examiner*—Bernard Rojas
(74) *Attorney, Agent, or Firm*—Fitzpatrick, Cella, Harper & Scinto

(57) ABSTRACT

An alignment apparatus moves an X-Y slider together with X and Y beams. Electromagnetic guides (electromagnetic mechanisms) are interposed between the X-Y slider, the X beam, and the Y beam. The electromagnetic guides include alignment and acceleration electromagnets attached to the X-Y slider, and targets attached to the X and Y beams. The alignment electromagnet is feedback-controlled, whereas the acceleration electromagnet is feedforward-controlled.

13 Claims, 12 Drawing Sheets

FIG. 12
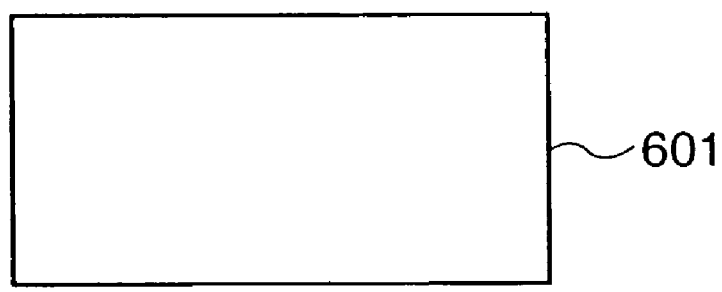
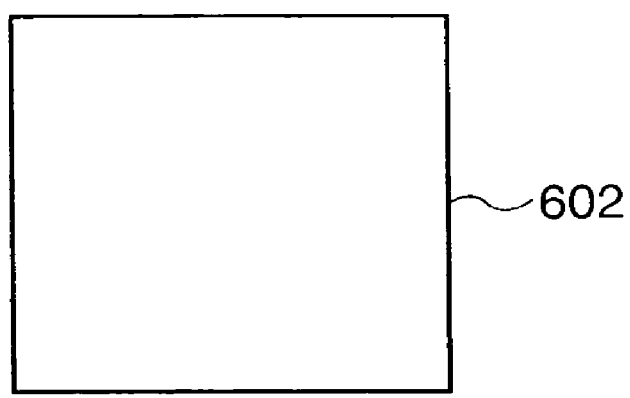

ALIGNMENT APPARATUS, EXPOSURE APPARATUS, AND DEVICE MANUFACTURING METHOD

FIELD OF THE INVENTION

The present invention relates to an alignment apparatus and, more particularly, to an alignment apparatus mounted in an exposure apparatus and a device manufacturing method.

BACKGROUND OF THE INVENTION

An exposure apparatus comprises a stage apparatus which moves a wafer. Such a moving stage apparatus is disclosed in, e.g., Japanese Patent No. 3,145,355. In this stage apparatus, a Y slider which is guided by a yaw guide and a stage surface plate is mounted on the stage surface plate. Air pads are interposed between the Y slider, the stage surface plate, and the yaw guide.

An X slider is so arranged as to surround the Y slider. Air pads are interposed between the side surfaces of the Y and X sliders. Air pads are also arranged between the X slider and the stage surface plate. With this arrangement, the Y slider is slidable in the Y direction. The X slider is slidable in the X direction on the Y slider, and thus slidable in the X and Y directions.

The X and Y sliders are driven using linear motors. The linear motors for driving the X and Y sliders are of a coil-fixed, movable magnet type. A coil is selected in accordance with the magnet position, and the magnitude and direction of a current are properly controlled, realizing long-stroke driving.

This stage apparatus can perform high-precision position control in a long stroke. When a six-axis fine moving stage capable of finely moving a substrate holding plate in X, Y, Z, θx, θy, and θz directions on the X slider is mounted on the X slider in the stage apparatus, a total mass of the X slider and a member on the X slider, i.e., a total mass of the X slider and fine moving stage increases. The exposure apparatus must accelerate the stage at high acceleration in order to increase the productivity. An increase in the total mass of the X slider and fine moving stage increases the force necessary for acceleration in proportion to the mass even at the same acceleration.

In the arrangement of the stage apparatus, a force for accelerating the X slider and fine moving stage in, e.g., the Y direction is generated by a Y linear motor. Part of the force is transferred to the X slider and fine moving stage via air pads. Letting $m_1$ be the mass of the Y slider system, $m_2$ be the mass of the X slider system, $m_3$ be the mass of the fine moving stage system, and $\alpha$ be the acceleration, two Y linear motors generate a force $(m_1+m_2+m_3)\times\alpha$. Of this force, a force $(m_2+m_3)\times\alpha$ is transferred to the X slider and fine moving stage via air pads between the side surfaces of the Y and X sliders.

The force transfer ability of the air pad becomes a problem. Force transfer by the air pad is only about 1 kgf/cm$^2$ in pressure conversion. If addition of the fine moving stage increases a force to be transferred to the X slider, the force may exceed the force transfer ability of the air pad. However, replacing the air pad with a rolling type guide is very difficult in an apparatus such as an exposure apparatus which is required to continuously operate for a long period and have high cleanliness because of shortening the useful life and generating dust.

Recently, demands have arisen for a stage apparatus suitable for use in a vacuum atmosphere in order to expose a finer pattern. To arrange air pads in the vacuum atmosphere, a means for recovering air must be arranged around the air pads. The periphery of this means does not contribute to thrust transfer, and the thrust transfer ability in pressure conversion further decreases.

In the arrangement of the stage apparatus, the noncontact guide between the X and Y sliders is formed by an air bearing such as a hydrostatic bearing, and constrained by spring rigidity. More specifically, the arrangement of a conventional stage apparatus is a coupled system in which one slider follows the motion of the other slider. This arrangement inhibits mechanical control (servo) of actively aligning the X and Y sliders, failing in high-precision alignment.

When, for example, disturbance is added to the Y slider, an alignment servo system for the Y slider inevitably influences that for the X slider because of the coupled system in which the X and Y sliders are constrained by the spring rigidity. The X slider cannot be aligned at high precision.

Even if the Y slider is feedforward-controlled in accordance with the position of the Y slider in order to cancel the moment of a force generated in the X slider, vibrations are added to the X slider. Both the X and Y sliders can hardly be aligned at high precision.

A conventional air bearing may be actively servoed. This method is poor in response characteristic, and hardly realizes high-precision alignment. In this case, the system holds a gap between the X and Y sliders by a gap sensor. The response characteristic is poor in terms of the system arrangement, and it is difficult to achieve high-precision alignment.

SUMMARY OF THE INVENTION

The present invention has been made in consideration of the above situation, and has as its object to provide an alignment apparatus capable of quickly accelerating/decelerating a structure to be aligned at high acceleration and aligning the structure at high precision, and an exposure apparatus having the alignment apparatus.

According to the first aspect of the present invention, there is provided an alignment apparatus comprising a structure to be aligned, a moving member which moves to align the structure, and an electromagnetic mechanism which electromagnetically applies a force between the structure and the moving member to allow the structure to move along with movement Of the moving member while forming a gap between the structure and-the moving member, the electromagnetic mechanism having a first electromagnetic actuator which is feedback-controlled on the basis of a deviation between a target position and an actual position of the structure, and a second electromagnetic actuator which is feedforward-controlled on the basis of the target position of the structure, and each of the first and second electromagnetic actuators having a pair of electromagnets which are so arranged as to generate forces in opposite directions on the same line, and a pair of targets which are arranged to face the pair of electromagnets, wherein an attractive force by a magnetic flux generated by the electromagnet acts on the target between the electromagnet and the target.

According to a preferred aspect of the present invention, at least one target is preferably so arranged as to be shared between at least two electromagnets.

According to another preferred aspect of the present invention, in feedback control, a current supplied to a coil of the electromagnet is preferably controlled in accordance with a value calculated by multiplying a square root of a force to be generated by the first electromagnetic actuator in order to reduce the deviation, by a correction term corresponding to a gap between the electromagnet and the target in the first electromagnetic actuator.

According to still another preferred aspect of the present invention, it is preferable that in feedforward control, the target position of the structure be converted into a command value for a magnetic flux to be generated by the electromagnet of the second electromagnetic actuator, and the electromagnet be controlled on the basis of a difference between the command value and a value of a magnetic flux generated by the electromagnet.

According to still another preferred aspect of the present invention, when one of the pair of electromagnets is driven, the other electromagnet is preferably not driven.

According to still another preferred aspect of the present invention, it is preferable that the apparatus further comprise two first electromagnetic actuators, and the second electromagnetic actuator be interposed between the two first electromagnetic actuators.

According to still another preferred aspect of the present invention, a line of force generated by the second electromagnetic actuator preferably coincides with a line passing through a barycenter of the structure.

According to still another preferred aspect of the present invention, a gap between the first electromagnetic actuator and the target is preferably not less than a gap between the second electromagnetic actuator and the target.

According to still another preferred aspect of the present invention, it is preferable that the apparatus further comprise two driving mechanisms which are arranged at two ends of the moving member to drive the moving member, and the two driving mechanisms drive the moving member by a thrust distributed in accordance with a position of the structure.

According to still another preferred aspect of the present invention, the thrust is preferably so distributed as to cancel a moment of a force around a barycenter of the moving member that is generated by a reaction force applied from the structure to the moving member.

According to still another preferred aspect of the present invention, the thrust is preferably distributed on the basis of a barycentric position of an integral structure of the structure and the moving member.

According to still another preferred aspect of the present invention, the thrust is preferably distributed on the basis of a barycentric position of the structure and a barycentric position of the moving member.

According to the second aspect of the present invention, there is provided an exposure apparatus which uses the above-described alignment apparatus to align a target object, and executes exposure operation.

According to the third aspect of the present invention, there is provided a device manufacturing method comprising steps of, by using the above-described exposure apparatus, transferring a pattern onto a substrate, and developing the substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 12 is a view showing the schematic arrangement of an exposure apparatus.

DETAILED DESCRIPTION OF THE PREFERRED EMBODIMENT

A preferred embodiment of the present invention will be described below with reference to the accompanying drawings.

Figure 1:
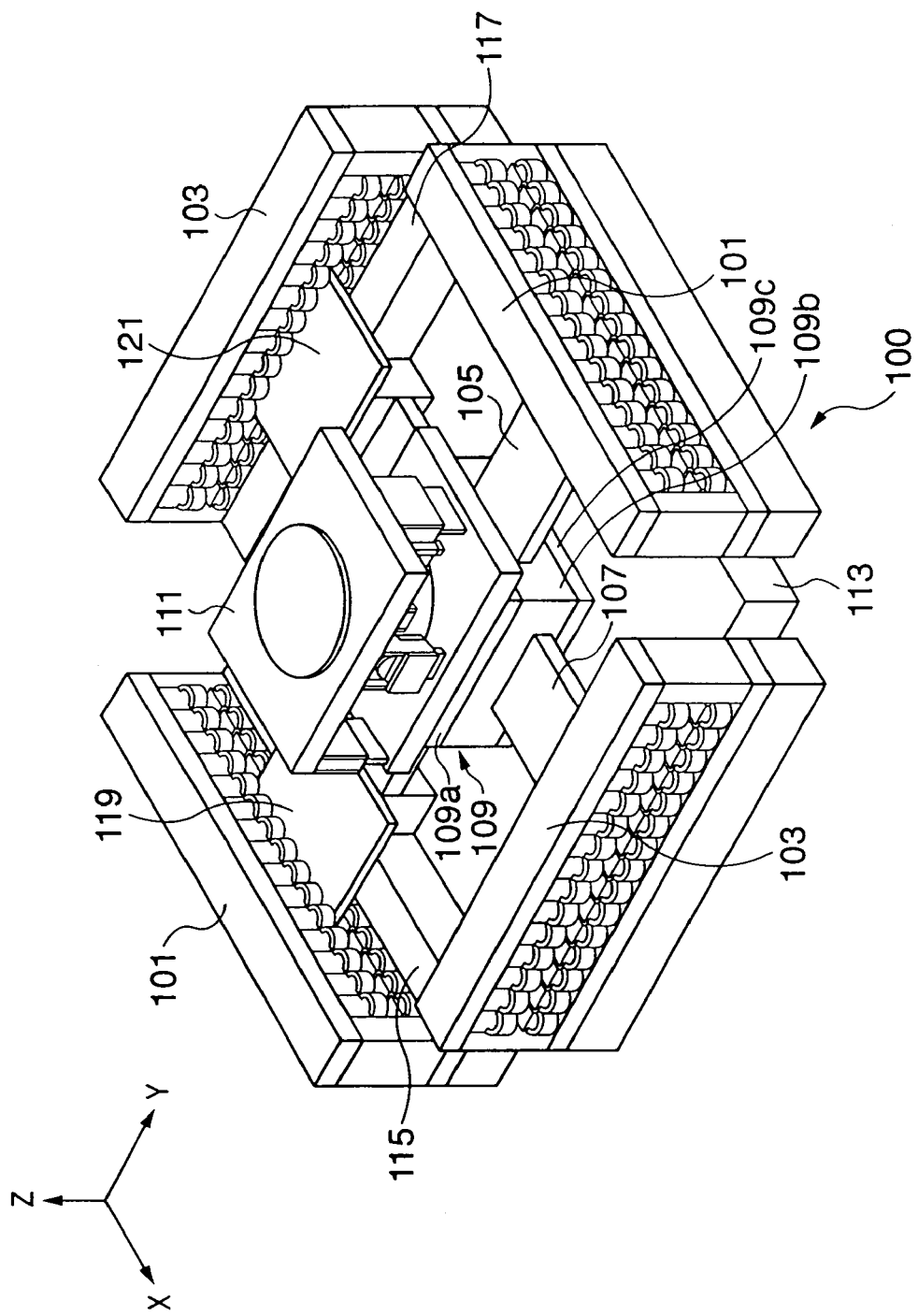
FIG. 1 is a perspective view showing the schematic appearance of a stage apparatus according to a preferred embodiment of the present invention.

FIG. 1 is a perspective view showing the schematic appearance of a stage apparatus according to the preferred embodiment of the present invention. This stage apparatus is constituted as a wafer stage apparatus for an exposure apparatus such as a semiconductor exposure apparatus. The stage apparatus of the present invention may be assembled in another apparatus.

A wafer stage apparatus 100 holds a wafer on a wafer chuck, transports the wafer to an alignment position or exposure position, and aligns the wafer. A coarse moving X beam 105 which is guided by a hydrostatic guide (not shown) so as to freely move on the X-Y plane is mounted on a stage surface plate 113. The posture of the coarse moving X beam 105 in the yaw direction is fixed to an X yaw guide 115 by using the hydrostatic guide (not shown). As a result, the coarse moving X beam 105 is so guided as to freely move in only the X direction. Similarly, a coarse moving Y beam 107 is guided by the stage surface plate 113 and a Y yaw guide 117 so as to freely move in only the Y direction.

X coarse moving linear motor movable elements 119 using permanent magnets are arranged at the two ends of the coarse moving X beam 105, whereas Y coarse moving linear motor movable elements 121 using permanent magnets are arranged at the two ends of the coarse moving Y beam 107. A pair of X coarse moving linear motor stators 101 are so arranged as to vertically sandwich the X coarse moving linear motor movable elements 119. A pair of Y coarse moving linear motor stators 103 are so arranged as to vertically sandwich the Y coarse moving linear motor movable elements 121.

The coarse moving linear motor stators 101 and 103 are constituted by winding a coil on an iron core having a multilayered structure of comb-tooth silicon steel thin plates. The attractive force of the magnet acts between the iron core and the coarse moving linear motor movable element. This attractive force is canceled by interposing the coarse moving linear motor movable element in the coarse moving linear motor stator at the same upper and lower gaps.

By supplying a current to the coils of the coarse moving linear motor stators 101 and 103, thrusts can be generated between the coarse moving linear motor stators 101 and 103 and the coarse moving linear motor movable elements 119 and 121. The coarse moving linear motor stators 101 and 103 and stage surface plate 113 are supported by the same structure, and the thrusts of the coarse moving linear motors act in the moving directions of the coarse moving X beam 105 and coarse moving Y beam 107.

Cube corner reflectors (not shown) are arranged on the coarse moving X beam 105 and coarse moving Y beam 107, and reflect laser beams from laser interferometers (not shown). The positions of the coarse moving X beam 105 and coarse moving Y beam 107 in their moving directions are measured by the laser interferometers. The coarse moving X beam 105 and coarse moving Y beam 107 are aligned by a control system (not shown) and the coarse moving linear motors on the basis of the measurement values of the laser interferometers.

An X-Y slider 109 is so arranged as to surround the coarse moving X beam 105 and coarse moving Y beam 107. The weight of the X-Y slider 109 is supported by the stage-surface plate 113 via a hydrostatic guide (not shown) attached to an X-Y slider bottom plate 109c. The X-Y slider 109 is so guided as to move within the X-Y plane on the stage surface plate 113. Electromagnetic guides (electromagnetic mechanisms) are interposed between the X-Y slider 109, the X beam 105, and the Y beam 107. The electromagnetic guides will be described later.

Figure 2:
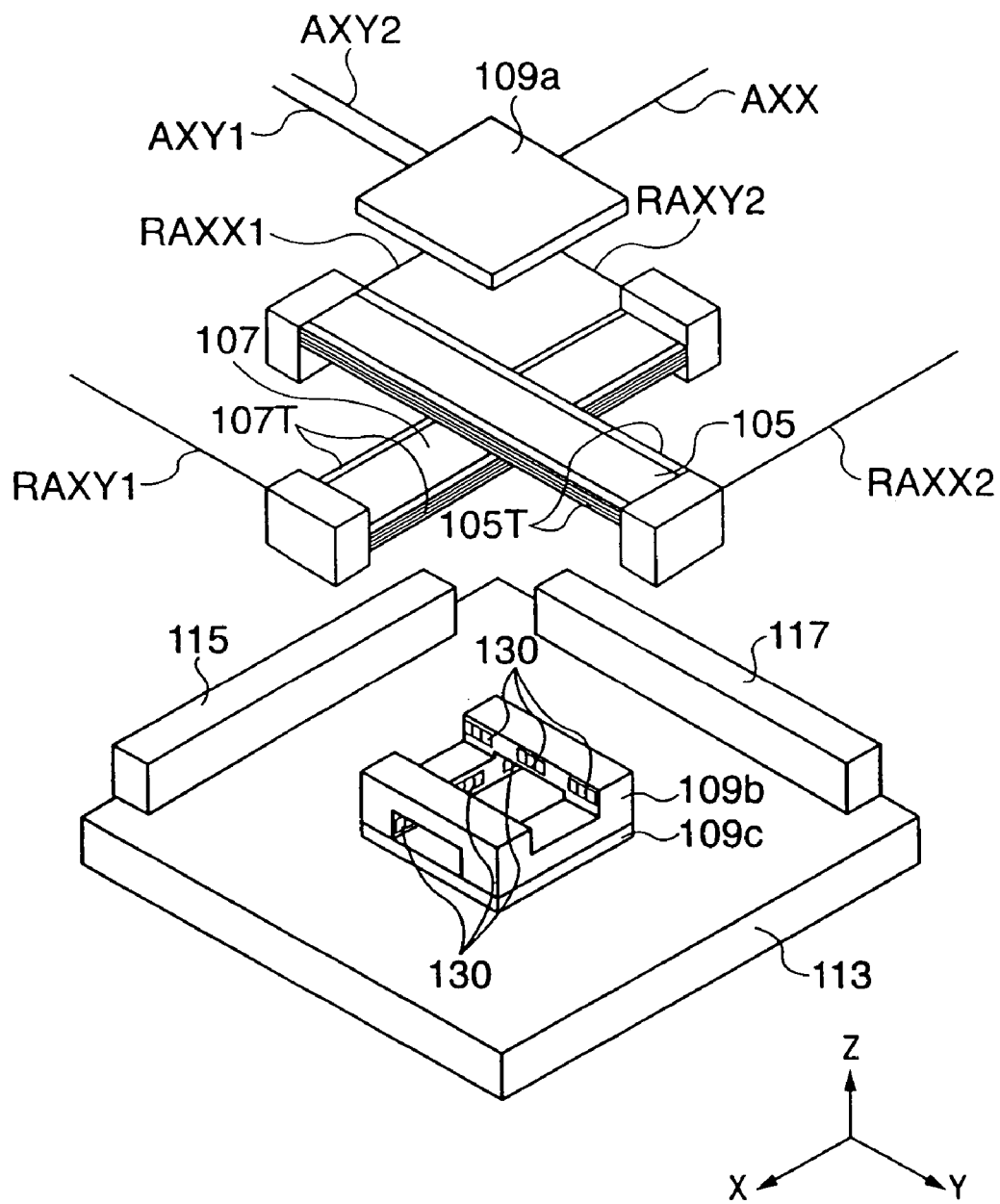
FIG. 2 is an exploded view showing part of the arrangement shown in FIG. 1 in the Z direction.

Reflecting mirrors are formed or fixed to proper portions on the X-Y slider 109, e.g., to the side surface of an X-Y slider top plate 109a. The position and posture of the X-Y slider 109 are measured by laser interferometers (not shown). FIG. 2 is an exploded view showing part of the arrangement shown in FIG. 1 in the Z direction. In the example shown in FIG. 2, laser interferometers having a laser beam axis AXX (measurement optical axis in the X direction) and laser beam axes AXY1 and AXY2 (measurement optical axes in the Y direction) as measurement optical axes are arranged for the X-Y slider 109, and can measure X and Y positions and ωz rotation. The laser interferometers for the X-Y slider 109 will be referred to as X-Y slider laser interferometers. In this case, ωz rotation can be calculated on the basis of the difference between measurement results by the laser interferometers having the laser beam axes AXY1 and AXY2 as optical axes, i.e., two Y position measurement values, and the interval between the laser beam axes.

Similarly, reflecting mirrors are formed or fixed to proper portions on the X beam 105 and Y beam 107, e.g., at the two ends of each beam. The positions and postures of the X beam 105 and Y beam 107 are measured by laser interferometers (not shown). In the example shown in FIG. 2, laser interferometers having laser beam axes RAXX1 and RAXX2 (measurement optical axes in the X direction) are arranged for the X beam 105, and measure the X position and ωz rotation of the X Beam 105. Laser interferometers having laser beam axes. RAXY1 and RAXY2 (measurement optical axes in the Y direction) are arranged for the Y beam 107, and measure the Y position and ωz rotation of the Y beam 107. The laser interferometers for the X beam 105 and Y beam 107 will be referred to as coarse moving stage laser interferometers.

A fine moving stage 111 in FIG. 1 is mounted on the X-Y slider 109. The fine moving stage 111 is insulated from vibrations from the X-Y slider 109 by a weight compensation system using repulsion of an air spring or magnet (not shown). A single-phase linear motor stator formed by a coil is fixed onto the X-Y slider 109. A single-phase linear motor movable element formed by a permanent magnet is fixed below the fine moving stage 111. A single-phase linear motor constituted by the stator and movable element can thrust the fine moving stage 111 in the X, Y, and Z directions and rotational directions ωx, ωy, and ωz around them. For example, single-phase linear motors are arranged at three positions having different X- and Y-coordinates to generate thrusts in the Z, ωx, and ωy directions. Also, two single-phase linear motors are arranged in the X direction, and two single-phase linear motors are arranged in the Y direction to generate thrusts in the X, Y, and ωz directions.

The fine moving stage 111 has a laser reflecting mirror (not shown). Displacement of the fine moving stage 111 at six degrees of freedom can be measured by a laser interferometer (not shown).

Figure 3:
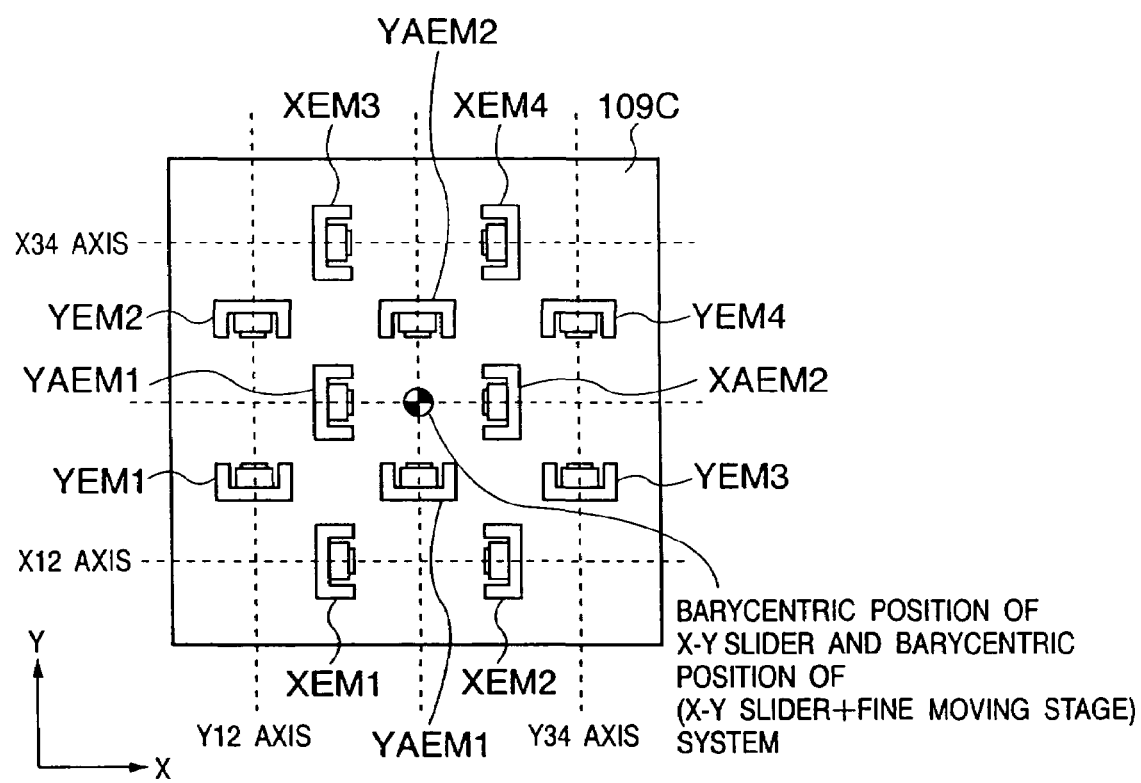
FIG. 3 is a view showing an example of the layout of electromagnets which constitute the electromagnetic actuator of an electromagnetic guide (electromagnetic mechanism)

FIG. 3 is a view showing the X-Y slider bottom plate 109c shown in FIG. 2 and electromagnets on it. Electromagnetic guides (electromagnetic mechanisms) between the X-Y slider 109, the X beam 105, and the Y beam 107 will be explained with reference to FIGS. 2 and 3.

This embodiment adopts electromagnetic guides as guide mechanisms between the X-Y slider 109 and the X beam 105 and Y beam 107 serving as moving members which move the X-Y slider 109. The electromagnetic guide (electromagnetic mechanism) is a noncontact guide (guide mechanism) in which a pair of electromagnetic actuators using a magnetic field generated by an electromagnet face each other so as to sandwich a beam. The electromagnetic actuator is comprised of a target (e.g., magnetic member) and an electromagnet. By adopting the electromagnetic guide instead of a conventional air guide, high thrust transfer ability can be obtained while the advantage of a noncontact guide is maintained. The electromagnetic guide does not use air, and is suitable for any use environment including a vacuum environment or reduced-pressure environment.

Figure 4:
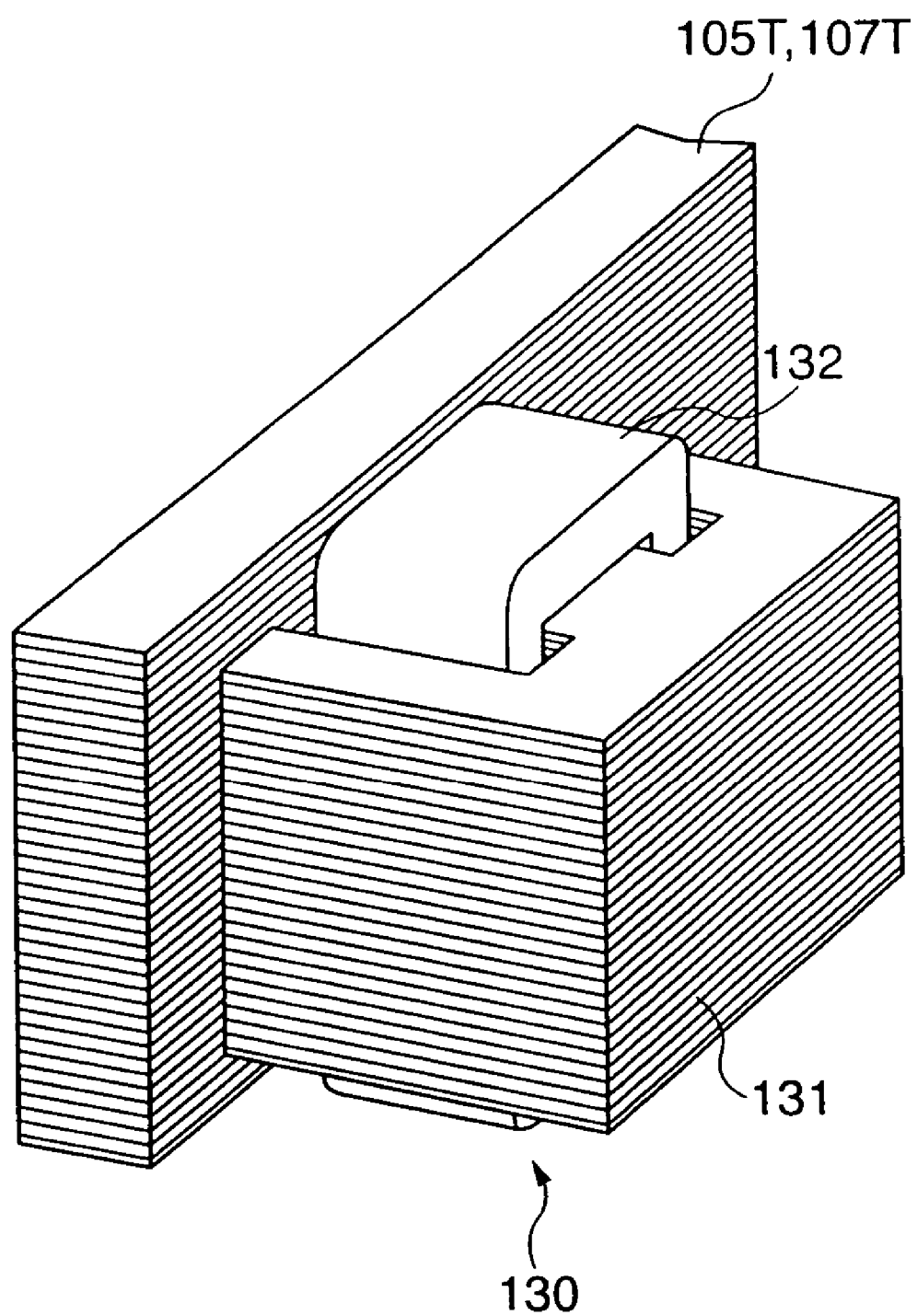
FIG. 4 is a perspective view showing an example of the structure of the electromagnetic actuator of the electromagnetic guide (electromagnetic mechanism)

Targets 105T and 107T can be constituted by stacking, e.g., silicon steel thin plates. The reason of employing the multilayered structure is to suppress the influence of an eddy current. FIG. 4 shows an example of the structure of the electromagnetic actuator. Each electromagnet 130 can be constituted by winding a coil 132 on an E-shaped core 131. By supplying a current to the coil 132, a magnetic flux passes through the E-shaped core 131 and target 105T (107T) to generate an attractive force between them.

The electromagnet 130 is attached to an X-Y slider intermediate member 109b. The X-Y slider 109 is comprised of the X-Y slider top plate 109a, X-Y slider intermediate member 109b, and X-Y slider bottom plate 109c.

FIG. 3 shows a concrete example of the layout of the electromagnets 130 shown in FIG. 2. The electromagnets 130 in FIG. 2 are represented as XEM1 to XEM4, XAEM1, XAEM2, YEM1 to YEM4, YAEM1, and YAEM2 in FIG. 3.

The electromagnets XEM1 to XEM4 generate a control force in X alignment, and the electromagnets YEM1 to YEM4 generate a control force in Y alignment. These electromagnets will be referred to as alignment electromagnets. The electromagnets XEM1 and XEM2, the electromagnets XEM3 and XEM4, the electromagnets YEM1 and YEM2, and the electromagnets YEM3 and YEM4 face each other to form electromagnet pairs.

A line passing through the centers of the electromagnets XEM1 and XEM2 will be referred to as an X12 axis; a line passing through the centers of the electromagnets XEM3 and XEM4, as an X34 axis; a line passing through the centers of the electromagnets YEM1 and YEM2, as a Y12 axis; and a line passing through the centers of the electromagnets YEM3 and YEM4, as a Y34 axis. The X12 and X34 axes are preferably arranged symmetrically about an X-axis passing through the barycenter of the structure (loads of the X beam 105 and Y beam 107) including the X-Y slider 109 and fine moving stage 111 within the X-Y plane. Similarly, the Y12 and Y34 axes are preferably arranged symmetrically about a Y-axis passing through the barycenter of the structure (loads of the X beam 105 and Y beam 107) including the X-Y slider 109 and fine moving stage 111 within the X-Y plane. With this arrangement, ωz rotation by control forces around the X- and Y-axes can be minimized.

The alignment electromagnets XEM1 to XEM4 and YEM1 to YEM4 receive a feedback control command from an electromagnet command calculation unit (to be described later). The feedback control command is a control command calculated in accordance with positional deviation information of the X-Y slider 109 that is obtained from a position command (target position of the X-Y slider 109) supplied to the position control system of the X-Y slider 109 and measurement values concerning the position and posture of the X-Y slider 109. The compensator of the position control system of the X-Y slider 109 can be a known PID compensator.

In addition to these alignment electromagnets, this embodiment comprises a pair of electromagnets XAEM1 and XAEM2 which face each other to generate a control force in accelerating the X-Y slider 109 in the X direction, and a pair of electromagnets YAEM1 and YAEM2 which face each other to generate a control force in accelerating the X-Y slider 109 in the Y direction. These electromagnets will be referred to as acceleration electromagnets.

A pair of X acceleration electromagnets XAEM1 and XAEM2 are preferably arranged on an X-axis passing through the barycenter of the structure (loads of the X beam 105 and Y beam 107) including the X-Y slider 109 and fine moving stage 111, that is, the force line of the pair of acceleration electromagnets is made to coincide with the X-axis of the structure. Similarly, a pair of Y acceleration electromagnets YAEM1 and YAEM2 are preferably arranged on a Y-axis passing through the barycenter of the structure (loads of the X beam 105 and Y beam 107) including the X-Y slider 109 and fine moving stage 111. While the stage apparatus is downsized, ωz rotation (rotation on the Z-axis) by control forces around the X- and Y axes can be minimized. If the force line of the pair of acceleration electromagnets deviates from the barycenter of the structure, a moment around the Z-axis occurs in acceleration/deceleration, decreasing the alignment precision and increasing the load (heat generation) of the alignment electromagnetic unit.

The acceleration electromagnets XAEM1, XAEM2, YAEM1, and YAEM2 receive a feedforward control command from an X-Y slider position command unit (to be described later). The feedforward control command is a value obtained by multiplying an acceleration serving as a driving command for the X-Y slider 109 by the mass of the structure (load of the X beam 105 and Y beam 107) including the X-Y slider 109 and fine moving stage 111. By adding feedforward control, a positional deviation in accelerating/decelerating the stage (accelerating/decelerating the X-Y slider 109) can be decreased to reduce a control command value generated in the feedback control system.

The X alignment electromagnets XEM1 and XEM3 (XEM2 and XEM4) and acceleration electromagnet XAEM1 (XAEM2) preferably share the target 105T for constituting an electromagnetic actuator, thereby downsizing the stage apparatus. This also applies to Y electromagnets.

As an electromagnetic guide, an alignment electromagnetic guide and acceleration electromagnetic guide are separately arranged to realize high alignment precision even in accelerating/decelerating the X-Y slider 109 (fine moving stage 111). With this arrangement, a structure to be aligned can be quickly accelerated/decelerated and aligned at high precision. This effect will be explained below.

In accelerating/decelerating the X-Y slider 109, the electromagnetic guide (electromagnetic mechanism) receives an accelerating/decelerating force obtained by multiplying by the acceleration the mass of the structure to be aligned that includes the X-Y slider 109 and fine moving stage 111 within the X-Y plane. For comparison, a case wherein the alignment electromagnet is also used as an acceleration electromagnet (i.e., no acceleration electromagnet exists) will be considered.

In accelerating the X-Y slider 109 in a position direction along the X-axis, the accelerating force must be transferred to the X-Y slider 109 via the X electromagnets XEM1 and XEM3. In this case, the electromagnets XEM1 and XEM3 must generate an attractive force corresponding to the accelerating force. The attractive force generated by the electromagnet is almost proportional to the square of a current flowing through the electromagnetic coil. That is, the resolving power of the attractive force changes depending on the magnitude of the attractive force. This is because a current command change upon a force change is large for a small attractive force of the electromagnet and small for a large attractive force.

In other words, the force resolving power of the electromagnet is not linear, and when a large force is generated, the resolving power decreases. When a large accelerating/decelerating force is generated, the force resolving power decreases to degrade the alignment precision of the X-Y slider 109. In the worst case, the surfaces of the electromagnetic guides contact each other, failing to function. Hence, an electromagnetic guide arrangement capable of transmitting a large accelerating/decelerating force and obtaining high alignment precision is required.

To meet this demand, according to the embodiment, an alignment electromagnetic guide and acceleration electromagnetic guide are separately arranged. With this arrangement, the acceleration electromagnet generates a large force necessary to accelerate/decelerate the X-Y slider (X-Y stage). The alignment electromagnetic guide suffices to generate an alignment force within a limited range regardless of a motion state such as acceleration, deceleration, uniform-velocity motion, or stop of the X-Y slider (X-Y stage). An alignment error owing to low resolving power of the acceleration electromagnetic guide in acceleration/deceleration is reduced by an alignment guide which can always exhibit high resolving power. Hence, according to the embodiment, the X-Y slider (X-Y stage) can be aligned at high precision by the alignment electromagnetic guide, and a large attractive force can be obtained by the acceleration electromagnetic guide in acceleration/deceleration.

By controlling the alignment electromagnetic guide by the feedback control system, the alignment electromagnetic guide receives a control command having a small value corresponding to a positional deviation. By controlling the acceleration electromagnetic guide by the feedforward control system, the acceleration electromagnetic guide receives a control command having a large value corresponding to an acceleration/deceleration command.

Figure 5:
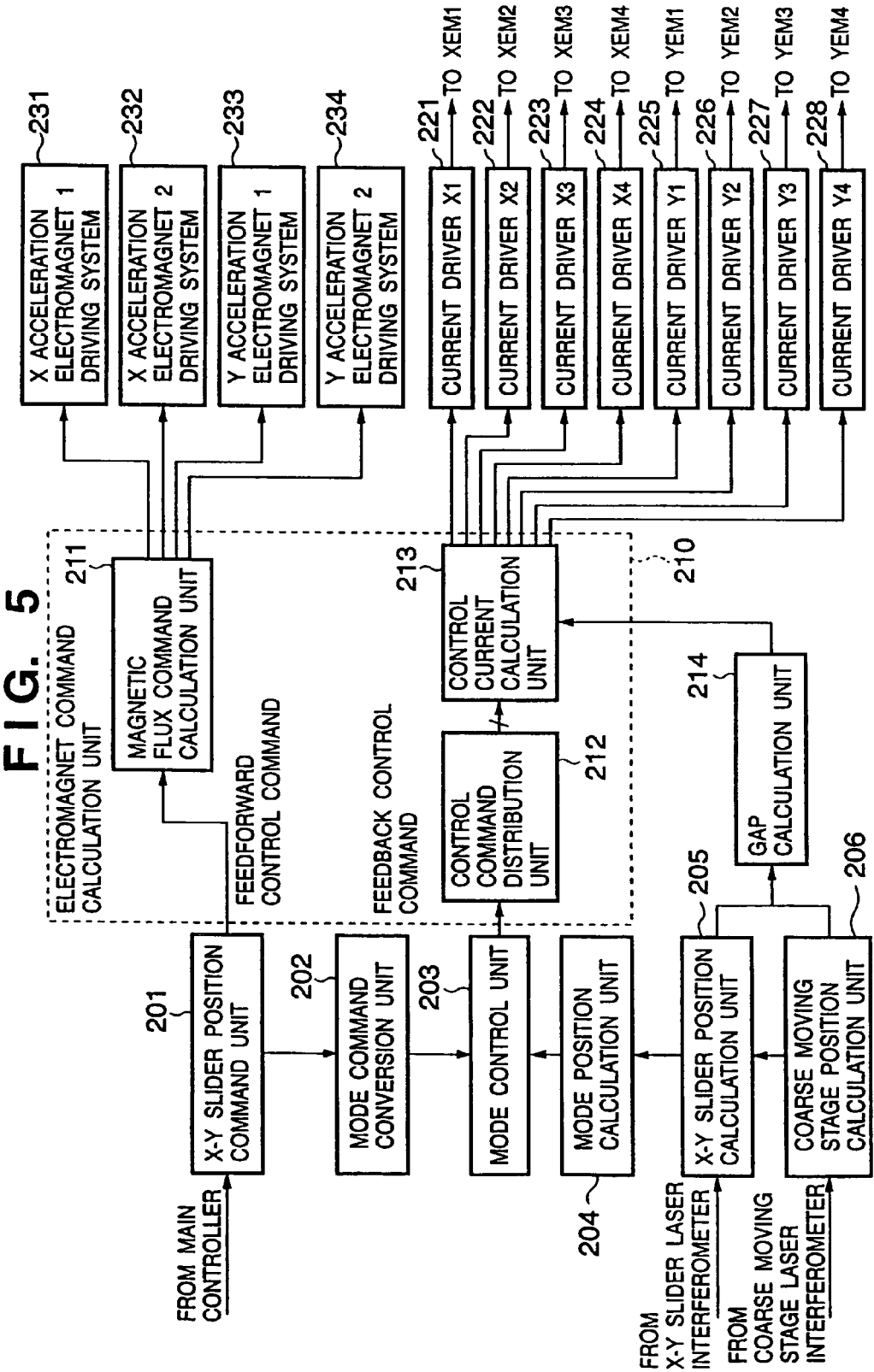
FIG. 5 is a block diagram showing a control system which controls the electromagnetic guide (electromagnetic mechanism) shown in FIGS. 2 and 3.

FIG. 5 is a block diagram showing a control system which controls the electromagnetic guide (electromagnetic mechanism) shown in FIGS. 2 and 3. This control system adopts a method called mode control. More specifically, this control system controls the position of the X-Y slider 109 on the basis of mode position commands for three axes, i.e., X and Y positions and the rotational direction $\omega z$ around the Z-axis at the barycentric position of the structure to be aligned that includes the X-Y slider 109, and the mode measurement values of the X-Y slider 109 that are provided as the position of the X-Y slider 109 from three laser interferometers (measurement axes are AXX, AXY1, and AXY2).

Control for each mode can avoid geometric interference in the rectilinear and rotational directions. A main control unit sends a stage moving command to an X-Y slider position command unit 201. The X-Y slider position command unit 201 calculates the position command (target position) of the X-Y slider 109. A mode command conversion unit 202 calculates mode position commands for X, Y, and $\omega z$ at the barycentric position of the structure including the X-Y slider 109 in accordance with the position command.

An X-Y slider position calculation unit 205 calculates the positions of the X-Y slider 109 at locations where laser beams impinge on reflecting mirrors, on the basis of measurement values by three X-Y slider laser interferometers which measure the position of the X-Y slider 109. A mode position calculation unit 204 converts the positions of the X-Y slider 109 that are calculated by the X-Y slider position calculation unit 205 into mode measurement values of the X-Y slider 109. The mode command conversion unit 202 and mode position calculation unit 204 incorporate barycentric position information of the structure including the X-Y slider 109, and execute calculation on the basis of pieces of geometric information.

A mode control unit 203 calculates the deviations of the mode axes on the basis of the mode position commands and mode measurement values, and generates mode control commands for canceling the deviations.

As described above, the barycenter of the structure to be accelerated is located on the force line of the acceleration electromagnet. The X-Y slider position command unit 201 can directly obtain feedforward control commands for X and Y accelerating/decelerating forces from the position command for the X-Y slider 109. The feedforward control commands are sent to a magnetic flux command calculation unit 211.

A control command distribution unit 212 distributes the mode control commands sent from the mode control unit 203 to force commands Xf12, Xf34, Yf12, and Yf34 for electromagnets arranged on the X12, X34, Y12, and Y34 axes on the basis of barycentric position information of the structure including the X-Y slider 109 and position information of each electromagnet. A force command along the $\omega z$ axis may be distributed to the X12 and X34 axes to set the $\omega z$ component to 0 on the Y12 and Y34 axes, or vice versa.

A method of driving the alignment electromagnet will be explained with reference to FIG. 6 by exemplifying the X12 axis. The same arrangement can also be applied to the X34, Y12, and Y34 axes. A control current calculation unit 213 has an arrangement shown in FIG. 6 for a pair of alignment electromagnets along each axis. A selection unit 401 arranged in the control current calculation unit 213 determines the sign of the X12 axis command Xf12. When the determination result is positive ("1" in FIG. 6), the electromagnet XEM2 out of the electromagnets XEM1 and XEM2 along the X12 axis is caused to generate a force, and a force command to the electromagnet XEM1 is set to 0. That is, an XEM2 command unit 403 sends a zero-current command (XI2 calculated in accordance with an arithmetic expression) to a current driver 222 which drives the coil of the electromagnet XEM2. An XEM1 command unit 402 sends a zero-current command (XI1=0) to a current driver 221 which drives the coil of the electromagnet XEM1. In this manner, heat generation of the electromagnet (coil) can be reduced by supplying a current to only one of a pair of electromagnets in accordance with the sign of the X12 axis command Xf12.

An attractive force generated by an electromagnet is proportional to the square of a magnetic flux $\phi$ of an electromagnet gap, and the magnetic flux $\phi$ is proportional to a current flowing through a coil. A force generated by an electromagnet can be considered to be almost proportional to the square of the coil current. From this, a current having the dimension of the square root of a force command is supplied to the coil of the electromagnet XEM2. More specifically, a current corresponding to a value calculated by multiplying the square root of a force command (XF12) by a correction value is supplied as a command current to the coil of the electromagnet XEM2.

The attractive force also depends on the electromagnet gap. The attractive force is almost proportional to a fraction of the square of the electromagnet gap. If the control performance is different between the X beam 105, the Y beam 107, and the X-Y slider 109, the positional deviations between them become different, and the electromagnet gap varies. Such variations change the attractive force of an electromagnet. If variations are not eliminated, the control system of the X-Y slider 109 cannot stand the nonlinearity of the attractive force variation, becomes unstable, and causes divergence in the worst case. To prevent this, the following gap variation correction is preferably performed.

More specifically, the X-Y slider position calculation unit 205 calculates the position of the X-Y slider 109 on the basis of positional information provided from X-Y slider laser interferometers (measurement axes are AXX, AXY1, and AXY2). A coarse moving stage position calculation unit 206 calculates the position of the coarse moving stage (X beam 105 and Y beam 107) on the basis of coarse moving stage laser interferometers (measurement axes are RAXX1, RAXX2, RAXY1, and RAXY2). A gap calculation unit 214 calculates gaps X1gap, X2gap, X3gap, X4gap, Y1gap, Y2gap, Y3gap, and Y4gap of the electromagnets XEM1, XEM2, XEM3, XEM4, YEM1, YEM2, YEM3, and YEM4 on the basis of the X-Y slider position and coarse moving stage position. The sign is positive for a larger gap. That is, as the gap value increases, the attractive force decreases.

Figure 6:
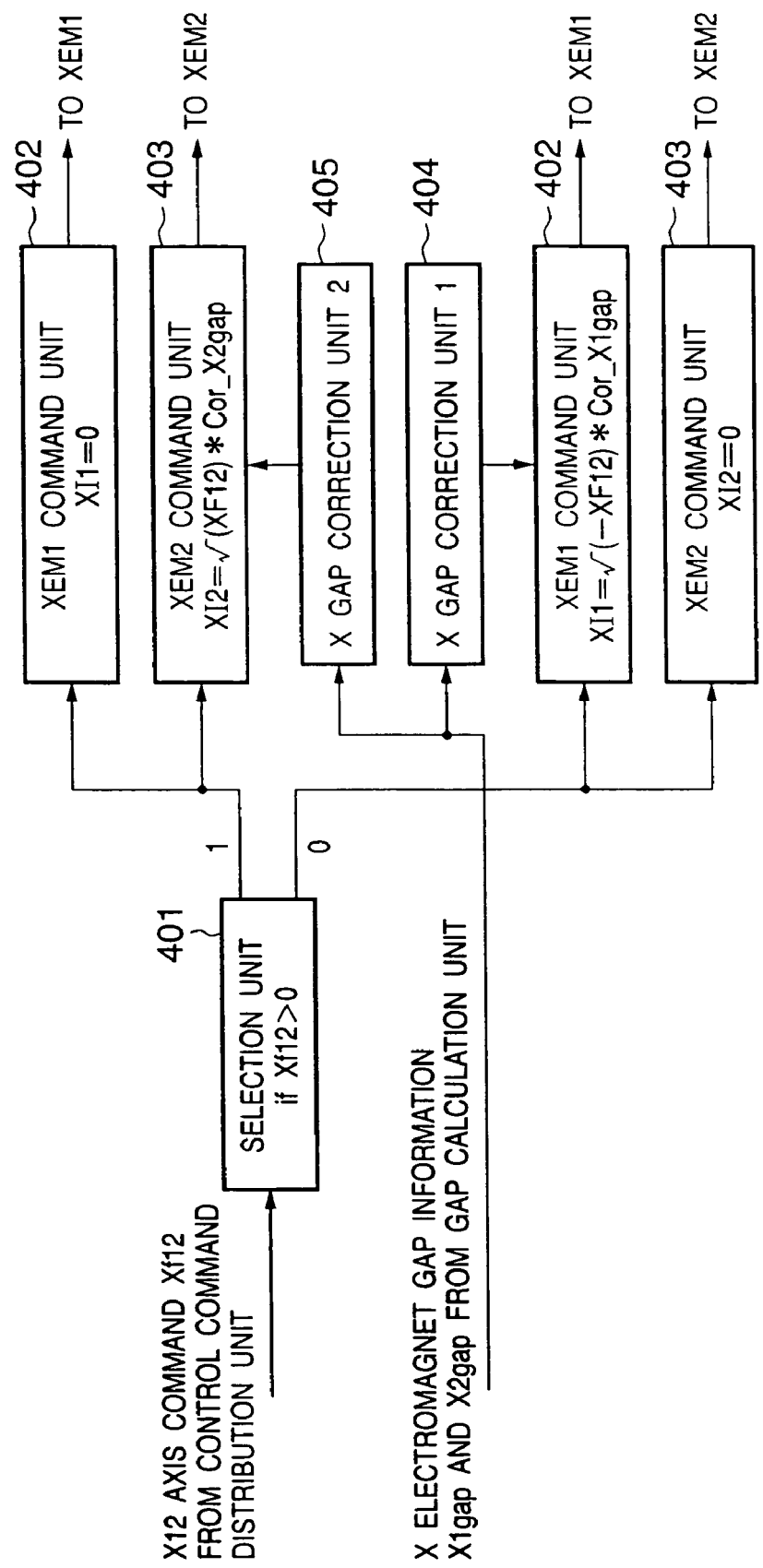
FIG. 6 is a block diagram for explaining a method of driving a pair of alignment electromagnets.

An X gap correction unit 2 (405) in FIG. 6 calculates a gap correction coefficient Col_X2gap:

Col_X2gap=1+X2gap/Gap where Gap is the standard gap value.

Gap is a standard gap value in the absence of gap variations, and the unit of Gap is the same as X2gap. In this case, the electromagnet gap is calculated from the measurement values of the X beam 105, Y beam 107, and X-Y slider 109. Alternatively, a gap sensor which measures the gap between an electromagnet and a target may be arranged near the electromagnet. The XEM2 command unit 403 calculates the product of the square root (Xf12) of the force command by the gap correction coefficient Col_X2gap, as a current command (XI2) to the current driver 222 which drives the coil of the electromagnet XEM2.

When the X12 axis command Xf12 is negative or 0 (determination result is "0" in FIG. 6), a current command to the current driver 222 which drives the coil of the electromagnet XEM2 is set to 0, and the product of the square root of the force command and the gap correction coefficient Col_X1gap is sent as a current command (XI1) to the current driver 221 which drives the coil of the electromagnet XEM1. Since Xf12 is negative, −1 is multiplied to change the sign to a positive value in calculating the square root. When Xf12 is 0, a command to the current driver 221 which drives the coil of the electromagnet XEM1 is also 0.

The remaining axes (X34, Y12, and Y34 axes) take the same arrangement as that of the X12 axis, and a description thereof will be omitted.

Currents corresponding to current commands (XI1 to XI4 and YI1 to YI4) provided from the control, current calculation unit 213 are supplied from current drivers (X1 to X4 and Y1 to Y4) 221 to 228 to the coils of the electromagnets XEM1 to XEM4 and YEM1 to YEM4. In this fashion, the electromagnetic guide of the X-Y slider 109 can be caused to generate a desired control force, and the X-Y slider 109 can be aligned at high precision. A control force to be generated by the alignment electromagnet suffices to be small, and the above-mentioned method of sending a current command to the current driver is simple and preferable.

A method of controlling the alignment electromagnet is a known one. A bias current is supplied to facing electromagnets, a current obtained by adding a control command current to a bias current is supplied to one electromagnet, and a current obtained by subtracting the control command current from the bias current is supplied to the other electromagnet. In this control method, heat generated by the coil increases along with an increase in bias current, and variations in attractive force upon gap variations cannot be suppressed. Therefore, a stage apparatus accompanied by large acceleration/deceleration preferably uses the alignment electromagnet control method as described in the embodiment.

Figure 7:
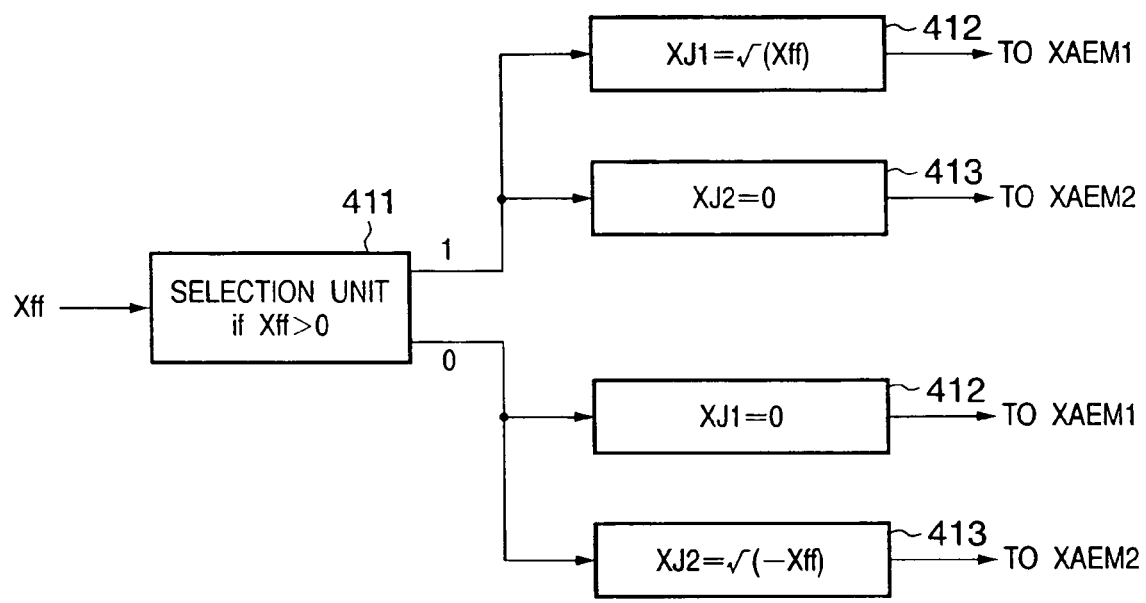
FIG. 7 is a block diagram for explaining a method of driving a pair of acceleration electromagnets.

A method of driving the acceleration electromagnet will be explained-with reference to FIGS. 7 and 8 by exemplifying the X acceleration electromagnets XAEM1 and XAEM2. Commands to the facing electromagnets XAEM1 and XAEM2 serving as a pair of acceleration electromagnets are distributed by the magnetic flux command calculation unit 211 in an electromagnet command calculation unit 210 in accordance with the sign of a feedforward control command. The magnetic flux command calculation unit 211 has an arrangement shown in FIG. 7 for the X acceleration electromagnets XAEM1 and XAEM2. The same arrangement can also be applied to the Y acceleration electromagnets YAEM1 and YAEM2.

An X feedforward control command Xff is sent from the X-Y slider position command unit 201 to the magnetic flux command calculation unit 211. A selection circuit 411 in the magnetic flux command calculation unit 211 determines the sign of the feedforward control command Xff. When the feedforward control command Xff is positive (determination result is "1" in FIG. 7), an XAEM1 command unit 412 sends a command XJ1 to the electromagnet XAEM1, and an XAEM2 command unit 413 sends a zero command XJ2 to the electromagnet XAEM2. When Xff is negative (determination result is "0" in FIG. 7), opposite commands are sent. A current is supplied to only one of a pair of electromagnets in accordance with the sign of the feedforward control command Xff, thereby reducing heat generation of the electromagnet (coil).

The acceleration electromagnet must generate a large accelerating/decelerating force, and preferably uses not a current command system used for the alignment electromagnet but a magnetic flux feedback control system which detects a magnetic flux and controls it on the dimension of the magnetic flux. In the embodiment, the dimension of a command to the acceleration electromagnets XAEM1 and XAEM2 is defined as the dimension of the magnetic flux. The dimension of the magnetic flux is the square root of the feedforward-control command. When Xff is negative, −1 is multiplied to reverse the sign, and then a square root is calculated.

Magnetic flux commands XJ1, XJ2, YJ1, and YJ2 to the respective acceleration electromagnets that are calculated by the magnetic flux command calculation unit 211 are sent to an X acceleration electromagnet 1 driving system 231 which drives the acceleration electromagnet XAEM1, an X acceleration electromagnet 2 driving system 232 which drives the acceleration electromagnet XAEM2, a Y acceleration electromagnet 1 driving system 233 which drives the acceleration electromagnet YAEM1, and a Y acceleration electromagnet 2 driving system 234 which drives the acceleration electromagnet YAEM2.

Figure 8:
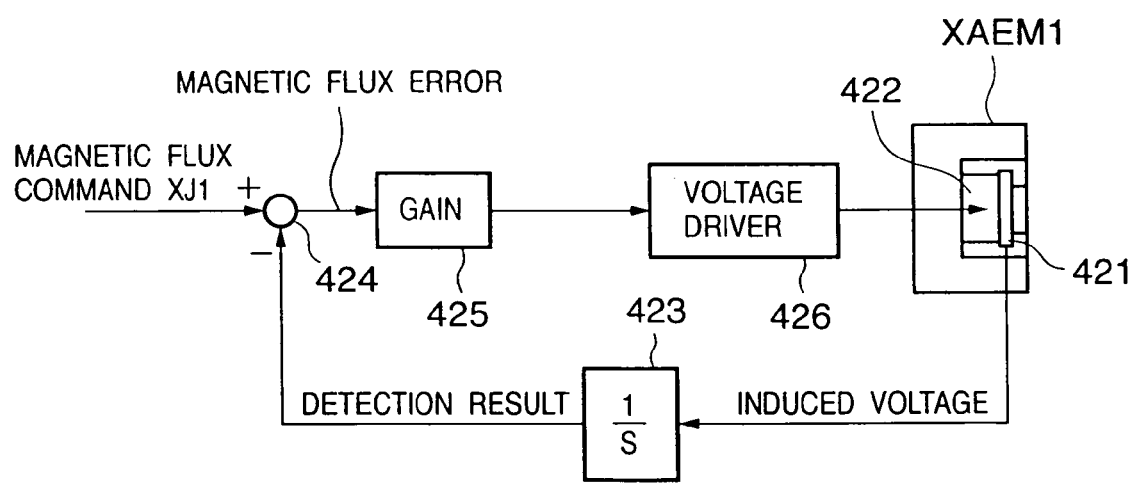
FIG. 8 is a block diagram for explaining a method of driving one acceleration electromagnet.

The electromagnet XAEM1 will be exemplified with reference to FIG. 8. In the acceleration electromagnet driving system.231, a magnetic flux detector is constituted by a search coil 421 and integrator 423 which are attached to the electromagnet XAEM1. The time change component of the magnetic flux in the electromagnet XAEM1 is generated as an induced voltage in the search coil 421 of the electromagnet XAEM1. The induced voltage is time-integrated by the integrator 423 to detect a magnetic flux generated by the electromagnet XAEM1. An adder 424 calculates a magnetic flux error as the difference between the magnetic flux command XJ1 and the detected magnetic flux. An amplifier 425 multiplies the magnetic flux error by a gain, and sends the product as a command to a voltage driver 426. A voltage is applied from the voltage driver to a coil 422 of the electromagnet XAEM1, and a current flows through the coil 422 to generate a magnetic flux in the electromagnet XAEM1.

The feedback loop shown in FIG. 8 is called a magnetic flux feedback loop. If the loop gain from the magnetic flux error to detected magnetic flux of the magnetic flux feedback loop is sufficiently high, the magnetic flux generated in the electromagnet XAEM1 is almost equal to the magnetic flux command XJ1. Since an attractive force generated by an electromagnet is proportional to the square of the magnetic flux, the attractive force is equivalently controlled by controlling the magnetic flux. When the magnetic flux command is 0, a force generated in the electromagnet XAEM1 and a current flowing through the coil are also 0.

The magnetic flux feedback loop is adopted for the acceleration electromagnets XAEM1, XAEM2, YAEM1, and YAEM2 because of the following reason. To drive the X-Y slider 109 at a large accelerating force by the coarse moving linear motor stators 101 and 103, the electromagnetic guides (acceleration electromagnets) between the X beam 105, the Y beam 107, and the X-Y slider 109 must generate a large force. Even if silicon steel almost free from a magnetic hysteresis characteristic is used as the material of the electromagnet, remanence is generated upon application of a large magnetic flux. The influence of remanence cannot be suppressed by only controlling the current, unlike the alignment electromagnet. As a result, the feedforward force generation precision decreases.

If a feedforward force error occurs, the position of the X-Y slider 109 deviates in acceleration/deceleration, and the number of feedback control commands increases. The alignment electromagnet must generate a large force, which conflicts with the concept of reducing a force to be generated by the alignment electromagnet. In magnetic flux feedback control, a magnetic flux is detected and controlled. The influence of remanence can be obtained by magnetic flux detection, and a large attractive force can be generated at high precision.

The alignment electromagnet generates a small force, and hardly generates remanence. The command is not an open command, unlike a feedforward control command, but a feedback command. Even if remanence exists, it can be ignored.

The stage arrangement is not limited to the above-described embodiment in applying the present invention. In the embodiment, the position of the X-Y slider is controlled in the X, Y, and ωz directions within the plane. The present invention can be applied to any arrangement which requires control of the position and transfer of the accelerating force. For example, the present invention can also be applied to control in only one translation direction or in one translation direction and one rotational direction (e.g., X and ωz).

In the above-described embodiment, the X-Y slider must be moved in a large moving range along the X and Y directions within the plane. For this purpose, the target is formed long, and the electromagnet surface moves on the target surface. In this case, the target is shared between the alignment and acceleration electromagnets, which is advantageous to downsizing the apparatus. However, targets may be independently arranged for the alignment and acceleration electromagnets.

Figure 9:
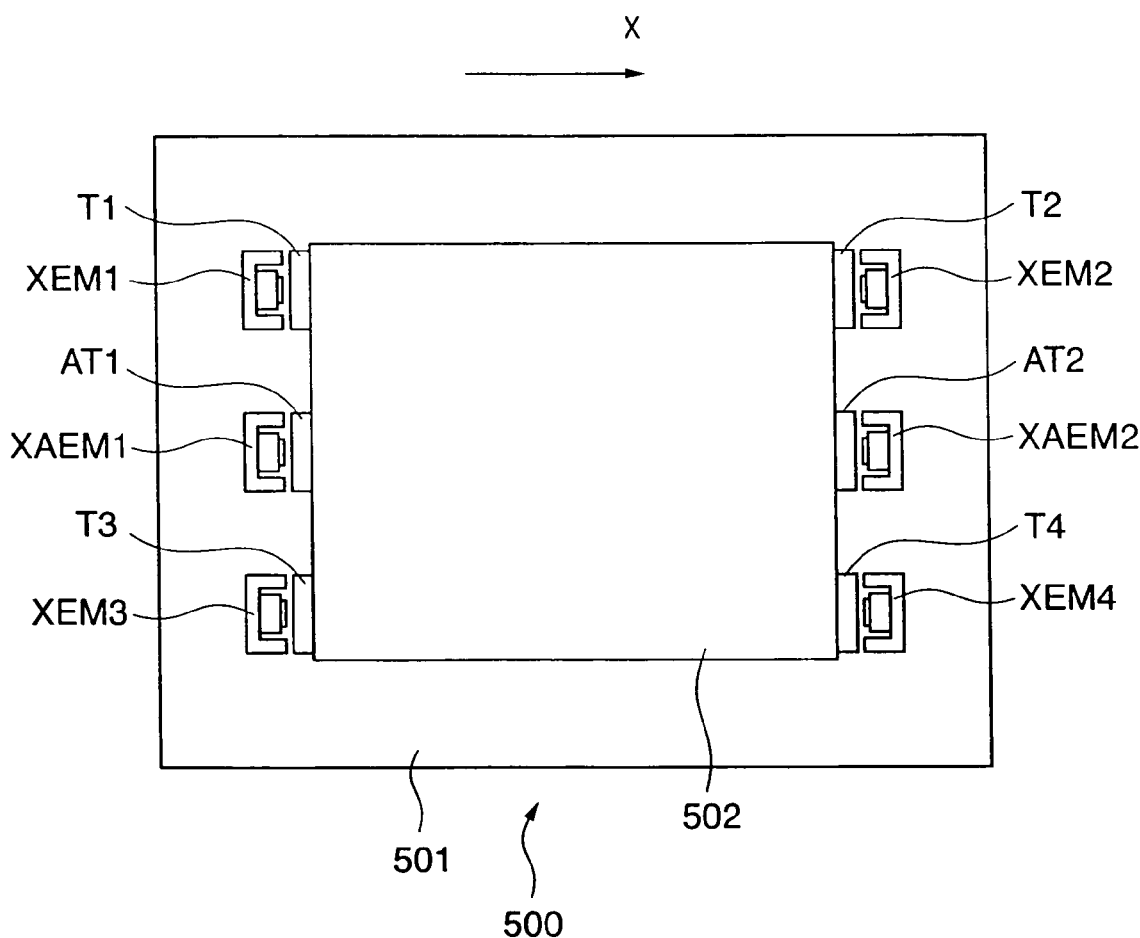
FIG. 9 is a plan view showing the arrangement of a stage apparatus according to another embodiment of the present invention.

When alignment and acceleration/deceleration transfer are performed in only one translation direction, the target surface and electromagnet surface do not greatly move within the plane, and targets may be independently arranged. An example of this arrangement is shown in FIG. 9. A first stage 501 moves in the X direction, and a second stage 502 is supported on the first stage 501 so as to freely move in the X and ωz directions. Electromagnets XEM1 to XEM4 serving as electromagnets for aligning and controlling the second stage 502, and electromagnets XAEM1 and XAEM2 serving as electromagnets for transmitting an accelerating/decelerating force are arranged on the first stage 501. Targets T1 to T4, AT1, and AT2 corresponding to the respective electromagnets are independently arranged on the second stage 502.

The arrangement shown in FIG. 9 is suitable as, e.g., a mask stage. In this case, a semiconductor exposure mask substrate is set on the second stage 502, and a decrease in exposure precision by thermal expansion of the second stage 502 must be prevented. For this purpose, it is preferable to fix the electromagnets serving as a heat generation source to the first stage 501, and fix the targets which do not generate heat to the second stage 502. The control system of each stage can be constituted by extracting only a control system for one direction from the arrangement shown in FIG. 5.

As described above, as the gap from a target becomes smaller, a force generated by an electromagnet becomes larger with the same current. Since the acceleration electromagnet must generate a large accelerating/decelerating force, the gap is desirably decreased to suppress heat generation of the coil. Since the alignment electromagnet suffices to generate a small force, the gap need not be so decreased in comparison with the acceleration electromagnet. The gap is preferably large in order to increase the gap variation correction precision described above. Further, the gap is preferably large in order to ensure a stroke in the ωz direction. From this, (gap between the alignment electromagnet and the target)≧(gap between the acceleration electromagnet and the target) is desirable in terms of the arrangement.

Figure 10:
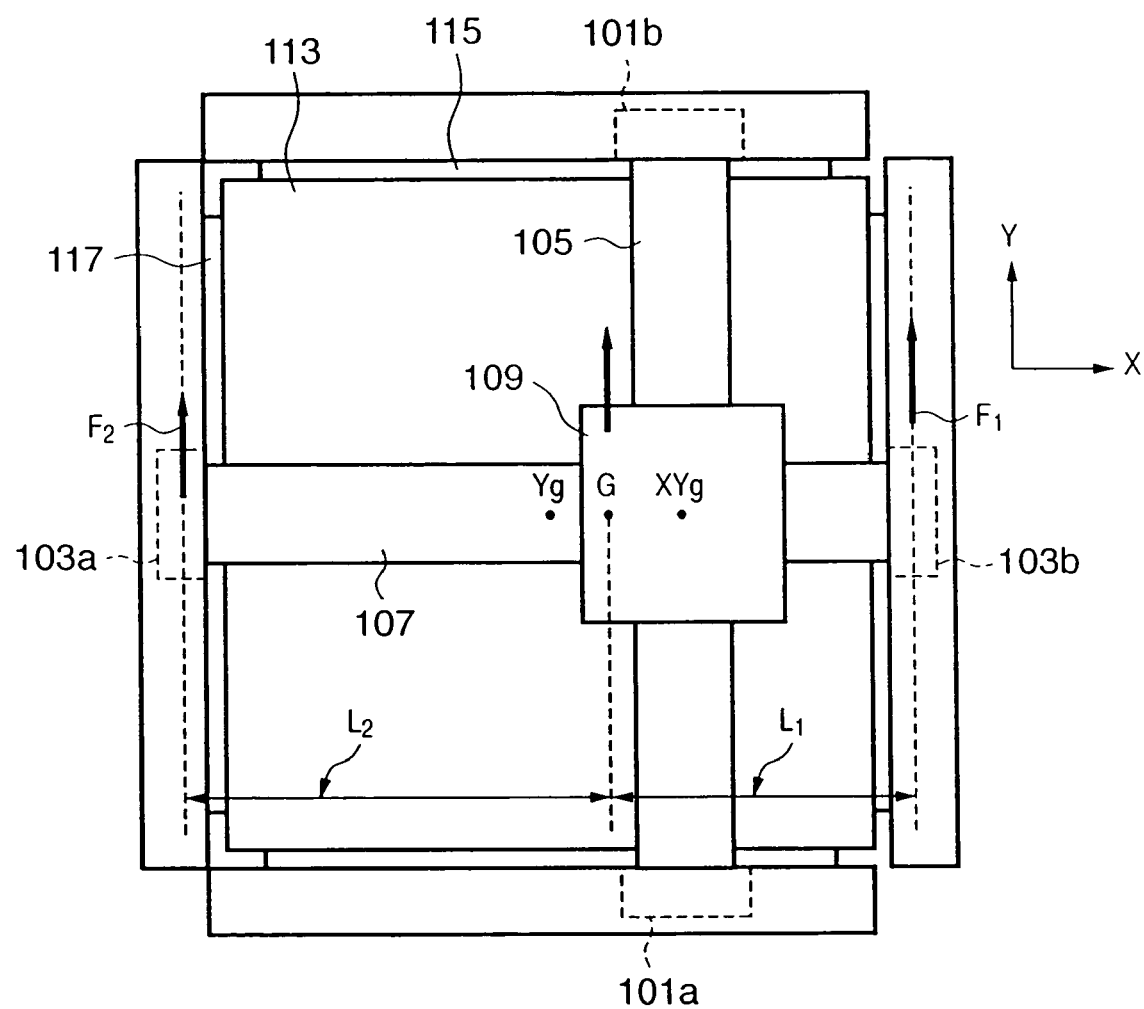
FIG. 10 is a view for explaining thrust distribution in the stage apparatus according to the preferred embodiment of the present invention.

FIG. 10 shows an example in which the noncontact guides between the X-Y slider 109, the X beam 105, and the Y beam 107 are formed by air bearings such as hydrostatic bearings. This example is a coupled system arrangement in which the X beam 105, Y beam 107, and X-Y slider 109 are constrained by spring rigidity, and the X-Y slider 109 follows the motions of the X beam 105 and Y beam 107. In this example, the X-Y slider 109 cannot be actively aligned or servoed, and the system is insufficient to high-precision alignment. Also, the coupled system in which the X beam 105, Y beam 107, and X-Y slider 109 are constrained by spring rigidity is applied to disturbance added to the X beam 105 and Y beam 107. The alignment servos for the X beam 105 and Y beam 107 influence the X-Y slider 109, and it is, therefore, difficult to align the X-Y slider 109 at high precision.

In an application of a system using a conventional air guide, driving devices on the two sides of each of the X beam 105 and Y beam 107 sequentially calculate the ratio of the distances between the position of the X-Y slider 109 and the driving devices in driving the X beam 105 and Y beam 107. The driving forces of the two driving devices at the two ends of each of the X beam 105 and Y beam 107 are adjusted in accordance with the position of the X-Y slider 109 on the basis of the calculation result.

For example, if the Y beam 107 moves in a state in which a barycenter XYg of the X-Y slider 109 and a barycenter Yg of the Y beam 107 deviate in the X direction, the Y beam 107 generates a moment force in the rotational direction around the Z-axis in accordance with a force received from the X-Y slider 109 via an air spring or the like. At this time, the thrust to be applied to linear motors 103a and 103b (driving devices) at the two ends of the Y beam 107 are distributed to cancel the moment force applied to the Y beam 107. The X beam 105, Y beam 107, and X-Y slider 109 are considered to be coupled via springs, and regarded as an integral structure to obtain a new barycenter G. The thrusts of the linear motors 103a and 103b at the two ends of the Y beam 107 are distributed at the ratio of the distances from the barycenter G to the linear motors 103a and 103b at the two ends regardless of acceleration/deceleration, uniform-velocity motion, or application of disturbance.

That is, this arrangement is a coupled system arrangement in which only the X beam 105 and Y beam 107 are actively controlled, and the X-Y slider 109 is constrained by the spring rigidity of the hydrostatic bearing and follows the motions of the X beam 105 and Y beam 107. This also applies to a case wherein the X beam 105 moves in the X direction when the barycenter of the X-Y slider 109 deviates from that of the X beam 105 in the Y direction.

Figure 11:
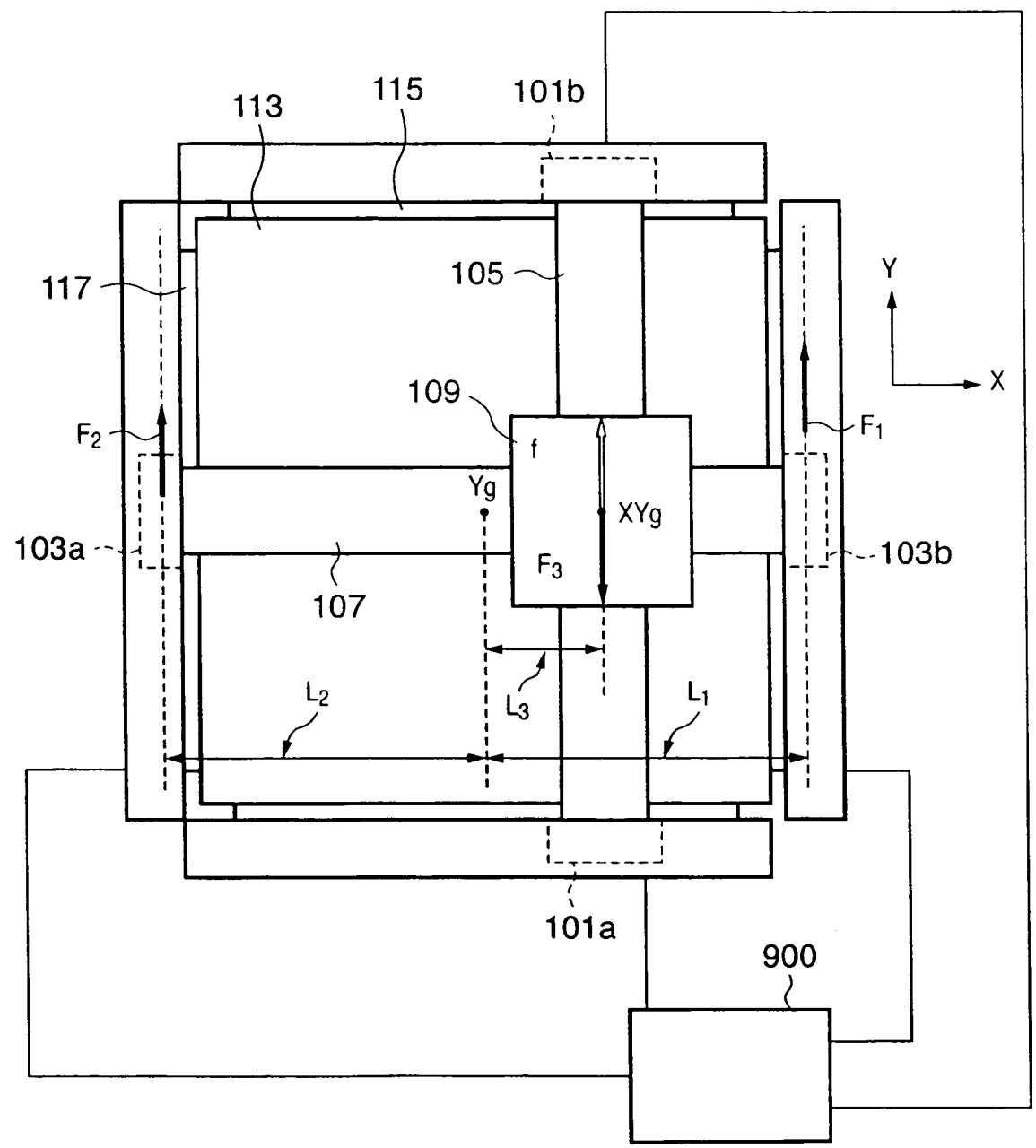
FIG. 11 is a view for explaining thrust distribution in the stage apparatus according to the preferred embodiment of the present invention.

As shown in FIG. 11, the electromagnetic guide according to the preferred embodiment of the present invention can be used to constitute a servo system in which the positions of the X beam 105, Y beam 107, and X-Y slider 109 are independently measured, and the X-Y slider 109, X beam 105, and Y beam 107 are separated from each other. More specifically, a driving system 900 independently supplies target positions to the X beam 105, Y beam 107, and X-Y slider 109, and independently actively performs alignment servo by independent feedback control systems. Compared to a conventional system, the alignment characteristics of the X beam 105, Y beam 107, and X-Y slider 109 are improved.

When the coupled system in which the X beam 105, Y beam 107, and X-Y slider 109 are constrained by spring rigidity is applied to disturbance to the X beam 105 and Y beam 107, the alignment servos of the X beam 105 and Y beam 107 always influence the X-Y slider 109. By adopting the X-Y slider 109 and a separated feedback control system for the X-Y slider 109, the X beam 105 and Y beam 107 can be aligned and servoed without influencing the alignment servo system of the X-Y slider 109. The alignment characteristics of the X beam 105, Y beam 107, and X-Y slider 109 are improved in comparison with a conventional system.

For example, if the electromagnetic unit generates a force in a state in which the barycenter XYg of the X-Y slider 109 deviates from the barycenter Yg of the Y beam 107 in the X direction, the force application point of the Y beam 107 deviates from the barycenter of the Y beam 107, generating a moment force in the rotational direction around the Z-axis.

The driving system 900 can also employ a method of calculating this moment force in advance, and sending a feedforward control command to the linear motors 103a and 103b at the two ends of the Y beam 107 so as to generate a force which has the same magnitude as that of the moment force in an opposite direction to cancel the moment force. The driving system 900 can reduce the positional deviation upon operating the X-Y slider 109, and further reduce a control command generated by the feedback control system. A method of canceling a moment force applied to the X beam 105 and Y beam 107 will be exemplified.

FIG. 11 is a view for explaining thrust distribution in the stage apparatus according to the preferred embodiment of the present invention. As shown in FIG. 11, let $F_1$ be the force applied to the right linear motor 103b, $F_2$ be the force applied to the left linear motor 103a, and $F_3$ be the reaction force applied from the X-Y slider 109 to the Y beam 107. Letting $L_1$ be the distance from the barycenter Yg of the Y beam 107 to the force application point of the right linear motor 103b, $L_2$ be the distance from the barycenter Yg of the Y beam 107 to the force application point of the left linear motor 103a, and $L_3$ be the distance from the barycenter Yg of the Y beam 107 to the barycenter XYg of the X-Y slider 109, $$F_1+F_2=F_3$$

$$F_1 \cdot L_1 - F_2 \cdot L_2 = F_3 \cdot L_3 \quad (1)$$

When the reaction force $F_3$ is generated by acceleration/deceleration of the X-Y slider 109, the reaction force $F_3$ can be expressed by the target acceleration of the X-Y slider 109 and the weight of the X-Y slider 109 (e.g., the sum of the weights of the X-Y slider 109 and fine moving stage). Letting m be the weight of the X-Y slider 109 and $a$ be the acceleration of the X-Y slider 109, the reaction force $F_3$ applied to the Y beam 107 is given by $$F_3 = m \cdot a \quad (2)$$

Equation (2) is substituted into equation (1) to determine distribution of feedforward control commands to the left and right linear motors 103a and 103b of the Y beam 107. The distribution equations are $$F_1 = (L_2 + L_3/L_1 + L_2) \times ma$$

$$F_2 = (L_1 - L_3/L_1 + L_2) \times ma \quad (3)$$

The driving system 900 can apply these forces as feedforward control commands to the linear motors 103a and 103b at the two ends of the Y beam 107 to cancel the moment force applied to the barycenter Yg of the Y beam 107.

When the X-Y slider 109 is not accelerated/decelerated in, e.g., uniform-velocity motion, or the reaction force $F_3$ upon application of disturbance on the X-Y slider 109 is generated by the general alignment servo-system of the X-Y slider 109, the driving system 900 can estimate a force generated by the electromagnetic unit, and distribute the force similarly to the case of acceleration/deceleration. The electromagnetic unit is known to be proportional to the square of the current and generated force reversely proportional to the square of the distance from an object to be attracted. Letting f be the estimated force, the reaction force applied to the Y beam 107 is given by $$F_3 = f \times i^2 / r^2 \quad (4)$$

where i is the current flowing through an electromagnet, and r is the distance (gap) from an electromagnet to a magnetic member. Equation (4) is substituted into equation (1) to determine distribution of feedforward control commands to the left and right linear motors 103a and 103b of the Y beam 107. The distribution equations are $$F_1 = (L_2 + L_3/L_1 + L_2) \times f$$

$$F_2 = (L_1 - L_3/L_1 + L_2) \times f \quad (5)$$

The driving system 900 can apply these forces as feedforward control commands to the linear motors 103a and 103b at the two ends of the Y beam 107 to cancel the moment applied to the barycenter Yg of the Y beam 107. When the barycenter XYg of the X-Y slider 109 deviates from the barycenter of the X beam 105 in the Y direction, the driving system 900 can adopt a method of applying feedforward control commands to linear motors 101a and 101b at the two ends of the X beam 105.

The method of canceling a moment force applied to the X beam 105 and Y beam 107 is not limited to those described above. For example, the driving system 900 can employ a method as shown in FIG. 10 in which the X beam 105, Y beam 107, and X-Y slider 109 are regarded as an integral structure to obtain a new barycenter G, and the thrusts of the X beam 105 and the linear motors 103a and 103b at the two ends of the Y beam 107 are distributed at the ratio of the distances from the barycenter G to the linear motors 103a and 103b at the two ends.

As described above, the acceleration and alignment electromagnetic units are separated. With this arrangement, in acceleration/deceleration of the stage that generates a larger moment force, a moment force around the Z-axis that is applied to each beam can be accurately calculated by inputting a target acceleration. The stage alignment characteristic can be greatly improved.

FIG. 12 is a view schematically showing the arrangement of an exposure apparatus which incorporates the above-described stage apparatus. In the example shown in FIG. 12, the stage apparatus shown in FIG. 1 is mounted as a wafer stage, and the stage apparatus shown in FIG. 9 is mounted as a mask stage. A mask stage 500 holds a mask by a chuck attached to a second stage 502. The wafer stage 100 holds a wafer by a chuck attached to the fine moving stage 111. The mask is illuminated with an illumination optical system 601, and a pattern image formed on the mask is projected and transferred onto the wafer via a projection optical system 602. A photosensitive layer on the wafer serving as a substrate bearing a pattern is developed to manufacture a semiconductor device. In this way, the exposure apparatus is applied to a known semiconductor device manufacturing process.

The present invention can quickly accelerate/decelerate a structure to be aligned at high acceleration, and align it at high precision.

As many apparently widely different embodiments of the present invention can be made without departing from the spirit and scope thereof, it is to be understood that the invention is not limited to the specific embodiments thereof except as defined in the claims.

What is claimed is:

1. An alignment apparatus comprising:
   a structure to be aligned;
   a moving member which moves to align said structure; and
   an electromagnetic mechanism which electromagnetically applies a force between said structure and said moving member to allow said structure to move along with movement of said moving member while forming a gap between said structure and said moving member, said electromagnetic mechanism having:
   (a) a first electromagnetic actuator which is feedback-controlled on the basis of a deviation between a target position and an actual position of said structure; and
   (b) a second electromagnetic actuator which is feedforward-controlled on the basis of the target position of said structure; and
   each of the first and second electromagnetic actuators having:
   (i) a pair of electromagnets which are so arranged as to generate forces in opposite directions on the same line; and
   (ii) a pair of targets which are arranged to face the pair of electromagnets,
   wherein an attractive force by a magnetic flux generated by the electromagnet acts on the target between the electromagnet and the target, and
   wherein in feedback control, a current supplied to a coil of the electromagnet is controlled in accordance with a value calculated by multiplying a square root of a force to be generated by the first electromagnetic actuator in order to reduce the deviation, by a correction term corresponding to a gap between the electromagnet and the target in the first electromagnetic actuator.

2. The apparatus according to claim 1, wherein at least one target is so arranged as to be shared between at least two electromagnets.

3. The apparatus according to claim 1, wherein in feed-forward control, the target position of said structure is converted into a command value for a magnetic flux to be generated by the electromagnet of the second electromagnetic actuator, and the electromagnet is controlled on the basis of a difference between the command value and a value of a magnetic flux generated by the electromagnet.

4. The apparatus according to claim 1, wherein when one of the pair of electromagnets is driven, the other electromagnet is not driven.

5. The apparatus according to claim 1, wherein the apparatus further comprises two first electromagnetic actuators, and the second electromagnetic actuator is interposed between the two first electromagnetic actuators.

6. The apparatus according to claim 1, wherein a line of force generated by the second electromagnetic actuator coincides with a line passing through a barycenter of said structure.

7. The apparatus according to claim 1, wherein a gap between the first electromagnetic actuator and the target is not less than a gap between the second electromagnetic actuator and the target.

8. The apparatus according to claim 1, wherein
   the apparatus further comprises two driving mechanisms which are arranged at two ends of said moving member to drive said moving member, and
   said two driving mechanisms drive said moving member by a thrust distributed in accordance with a position of said structure.

9. The apparatus according to claim 8, wherein the thrust is so distributed as to cancel a moment of a force around a barycenter of said moving member that is generated by a reaction force applied from said structure to said moving member.

10. The apparatus according to claim 9, wherein the thrust is distributed on the basis of a barycentric position of an integral structure of said structure and said moving member.

11. The apparatus according to claim 9, wherein the thrust is distributed on the basis of a barycentric position of said structure and a barycentric position of said moving member.

12. An exposure apparatus which uses an alignment apparatus as defined in claim 1 to align a target object, and executes an exposure operation.

13. A device manufacturing method comprising steps of:
   using an exposure apparatus defined in claim 12:
   transferring a pattern onto a substrate; and
   developing the substrate.

* * * * *

UNITED STATES PATENT AND TRADEMARK OFFICE
CERTIFICATE OF CORRECTION

PATENT NO. : 7,193,493 B2
APPLICATION NO. : 10/670241
DATED : March 20, 2007
INVENTOR(S) : Toshiya Asano It is certified that error appears in the above-identified patent and that said Letters Patent is hereby corrected as shown below:

ON THE TITLE PAGE:
    In item "(56) References Cited," under "U.S. PATENT DOCUMENTS," in the second column, the first-listed document "5,841,250 A  11/1998 Korenage et al. ..........318/135" should read -- 5,841,250 A  11/1998 Korenaga et al. ..........318/135 --.
    In item, "(56) References Cited," under "FOREIGN PATENT DOCUMENTS," the first-listed document "JP  09167792  6/1997" should read -- JP  09-167792  6/1997 --.

COLUMN 2:
    Line 46, "Of" should read -- of --.
    Line 47, "and-the" should read -- and the --.

COLUMN 6:
    Line 3, "Beam" should read -- beam --.
    Line 4, "axes." should read -- axes --.

COLUMN 7:
    Line 58, "Y" should read -- Y- --.

COLUMN 11:
    Line 34, "control," should read -- control --.
    Line 59, "explained-with" should read -- explained with --.

COLUMN 12:
    Line 28, "feedforward-control" should read -- feedforward control --.
    Line 44, "system.231," should read -- system 231, --.

COLUMN 13:
    Line 37, "to, any" should read -- to any --.

COLUMN 14:
    Line 32, "to" should read -- to perform --.

COLUMN 16:
    Line 28, "generated" should read -- to generate a --.

UNITED STATES PATENT AND TRADEMARK OFFICE
CERTIFICATE OF CORRECTION

PATENT NO. : 7,193,493 B2
APPLICATION NO. : 10/670241
DATED : March 20, 2007
INVENTOR(S) : Toshiya Asano It is certified that error appears in the above-identified patent and that said Letters Patent is hereby corrected as shown below:

COLUMN 18:
  Line 52, "apparatus" should read -- apparatus as -- and "claim 12:" should read -- claim 12; --.

Signed and Sealed this

Eleventh Day of December, 2007

JON W. DUDAS
*Director of the United States Patent and Trademark Office*